United States Patent [19]

Kim

[11] Patent Number: 5,406,528
[45] Date of Patent: Apr. 11, 1995

[54] DATA OUTPUT BUFFER

[75] Inventor: Jae H. Kim, Kyoungki, Rep. of Korea

[73] Assignee: Hyundai Electronics Industries Co., Ltd., Kyoungki, Rep. of Korea

[21] Appl. No.: 223,638

[22] Filed: Apr. 6, 1994

[30] Foreign Application Priority Data

Apr. 9, 1993 [KR] Rep. of Korea .............. 93-5953

[51] Int. Cl.$^6$ ............................................. G11C 13/00
[52] U.S. Cl. ................... 365/230.08; 365/206; 365/189.05
[58] Field of Search .......... 365/203, 204, 206, 189.04, 365/189.05, 230.08

[56] References Cited

U.S. PATENT DOCUMENTS 5,088,062 2/1992 Shikata ..................... 365/189.04

Primary Examiner—Terrell W. Fears
Attorney, Agent, or Firm—Popham, Haik, Schnobrich & Kaufman, Ltd.

[57] ABSTRACT

A data output buffer in a semiconductor memory device capable of minimizing generation of ground noise in data being transmitted to an external circuit device via an output line. The data output buffer includes a first input line for inputting true data, a second input line fox inputting complement data, a pull-up transistor connected among a first power supply source, an output line and the first input line, a pull-down transistor connected among a second power supply source, the output line and the second input line, and a resistance-varying transistor for controlling an amount of current being supplied from the second input line to the pull-down transistor, and thereby removing a noise signal to be included in output data of low logic on the output line.

9 Claims, 2 Drawing Sheets

| Power Supply Vcc−GND | Temparature | | Prior Art | Present Invention |
|---|---|---|---|---|
| 5v | 25°c | Peak Current(mA) | 26 | 20 |
| | | dI/dt | 10 | 7.7 |
| 6v | −10°c | Peak Current(mA) | 43 | 25 |
| | | dI/dt | 22 | 10 |
| 8v | −10°c | Peak Current(mA) | 66 | 33 |
| | | dI/dt | 40 | 11 |
| 9v | −10°c | Peak Current(mA) | 77 | 38 |
| | | dI/dt | 48 | 15 |

Fig. 3

DATA OUTPUT BUFFER

BACKGROUND OF THE INVENTION

1. Field of the Invention

The present invention relates to a data output buffer for externally transmitting data read in memory cells of a semiconductor memory device via output lines, and more particularly to such a data output buffer capable of minimizing generation of ground noise in data of low logic.

2. Description of the Prior Art

Data output buffers employed in typical semiconductor memory devices such as dynamic random access memories (DRAMs) and static random access memories (SRAMs) have a function for matching input impedance of an external circuit device connected to an output line with output impedance of a sense amplifier for sensing and amplifying data from a memory cell. Such data output buffers need a transistor with a high channel width and supply voltages exhibiting a high voltage level difference because of a relatively high input impedance of the external circuit device. The high channel-width transistor varies steeply the current on the output line at both the leading and trailing edges of output data, thereby generating noise at the edge portions of output data. The noise generated in the output data becomes larger as the voltage level difference between the supply voltages goes up.

Among noise involved in output data, those included in high logic involve a steep variation and have a large amount of current, as compared to those included in low logic. For this reason, the conventional data output buffers may have an adverse effect of damaging external circuit devices connected to output lines and output drivers. Such a problem encountered in the conventional data output buffers will be described in detail, in conjunction with FIG. 1.

FIG. 1 is a circuit diagram of one example of the conventional data output buffers. As shown in FIG. 1, the data output buffer includes a first NOR Gate 10 for receiving true data/TD of low logic from a first input line 11 and a second NOR Gate 12 for receiving complement data/CD of low logic from a second input line 13. The first NOR gate 10 selves to invert the true data/TD received from the first input line 11 in response to a low logic signal received from a first inverter 14 and then transmit the inverted true data/TD to a second inverter 16. In similar, the second NOR Gate 12 serves to invert the complement data /CD received from the second input line 13 in response to a low logic signal received from a first inverter 14 and then transmit the inverted complement data/CD to the gate of an NMOS transistor 20 via a node 17. The first inverter 14 inverts an enable signal EN applied to a control line 15 and then sends the inverted enable signal to both the first NOR Gate 10 and the second NOR Gate 12. Consequently, the first and second NOR Gates 10 and 12 perform their transmission operations when an enable signal EN of high logic is applied to the control line 15.

On the other hand, the second inverter 16 inverts the already inverted true data from the first NOR gate 10 again and then sends the resultant true data to the Gate of a PMOS transistor 18 via a node 19. The PMOS transistor 18 is turned on when true data of low logic from the second inverter 16 is applied to the gate thereof. The activated PMOS transistor 18 supplies a supply voltage from a first power supply source Vcc to an output line 21, so that data of high logic can be outputted through the output line 21. The NOMS transistor 20 is turned on when the inverted complement data from the second NOR Gate 12 applied to the Gate thereof has high logic. The activated NMOS transistor 20 supplies a supply voltage from a second power supply source, namely, Ground GND to the output line 21, so that data of low logic can be transmitted to the external circuit device via the output line 21.

In this conventional data output buffer, however, current flowing from the output line 21 to the ground GND via the NMOS transistor 20 is steeply decreased in amount because of a steep increase in current at the leading edge of the output signal from the second NOR gate 12 being applied to the node 17. As a result, the ground noise is generated at the trailing edge of data transmitted to the external circuit device via the output line. Furthermore, the conventional data output buffer generates, in output data, a noise signal with a higher current variation depending on the peak output current and time as the voltage level difference between the power supply sources $V_{cc}$ and GND goes up.

SUMMARY OF THE INVENTION

Therefore, an object of the invention is to provide a data output buffer capable of minimizing generation of ground noise in data being transmitted to an external circuit device via an output line.

In accordance with the present invention, this object can be accomplished by providing a data output buffer in a semiconductor memory device comprising: a first input line for inputting true data; a second input line for inputting complement data; a pull-up transistor connected among a first power supply source, an output line and said first input line; a pull-down transistor connected among a second power supply source, said output line and said second input line; and variable resistor means for controlling an amount of current being supplied from the second input line to said pull-down transistor, and thereby removing a noise signal to be included in output data of low logic on the output line.

BRIEF DESCRIPTION OF THE DRAWINGS

These and other objects, features and advantages of the invention will become more apparent upon a reading of the following detailed specification and drawings, in which:

FIG. 3 is a table showing a variation in peak output current and an instantaneous variation in output current in the data output buffer of the present invention depending on the voltage level difference between the power supply sources Vcc and GND, as compared to those in the conventional data output buffer.

DETAILED DESCRIPTION OF THE PREFERRED EMBODIMENTS

Figure 1:
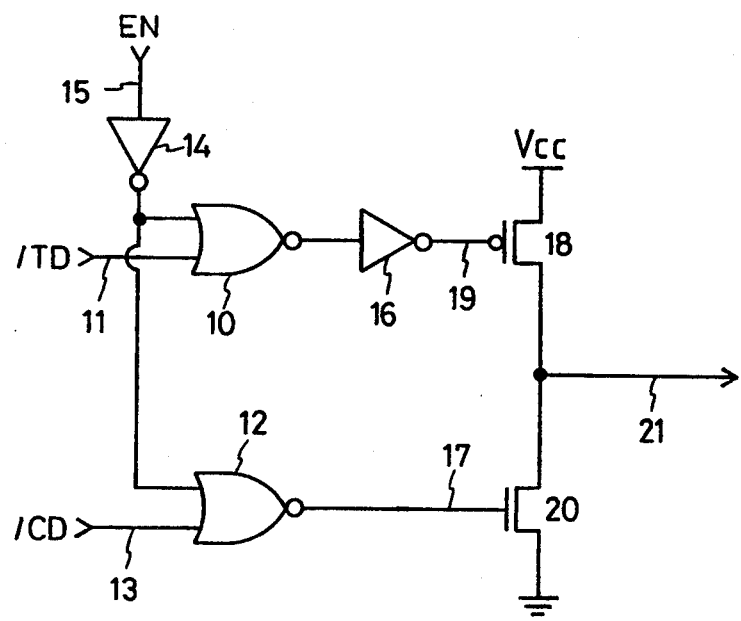
FIG. 1 is a circuit diagram of a conventional data output buffers.
Figure 2:
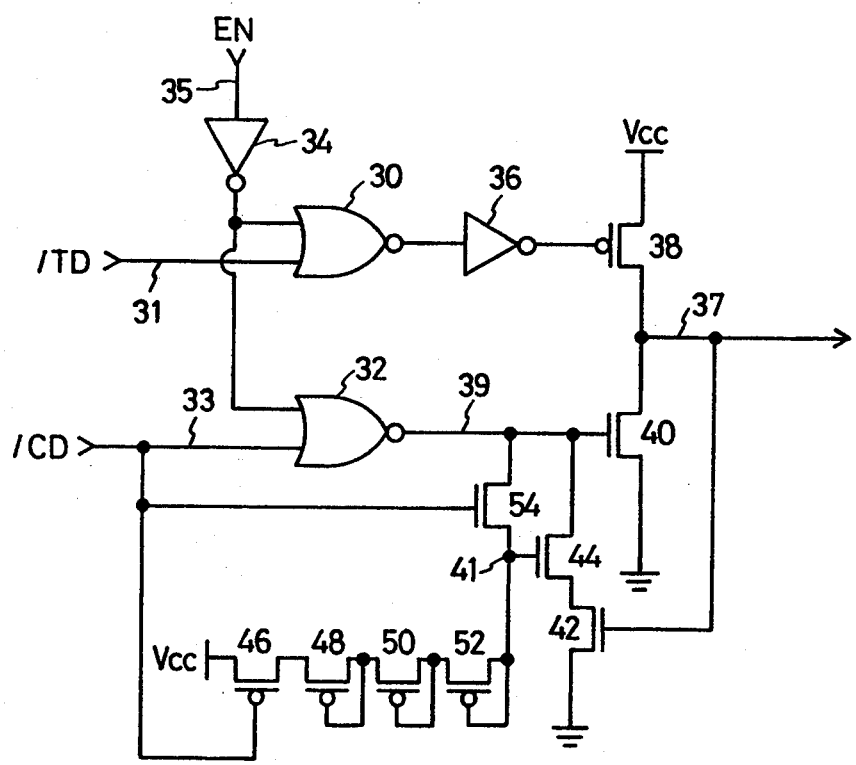
FIG. 2 is a circuit diagram of a data output buffer in accordance with the present invention.

FIG. 2 is a circuit diagram of a data output buffer in accordance with the present invention. As shown in FIG. 2, the data output buffer includes a first NOR gate 30 for receiving true data/TD of low logic from a first input line 31 and a first inverter 34 for receiving an enable signal EN from a control line 35. The first inverter 34 is adapted to invert the enable signal EN received from the control line 35 and then send the inverted enable signal to the first NOR gate 30. When the inverted enable signal from the first inverter 14 has low logic, the first NOR gate 30 inverts the true data/TD received from the first input line 31 and then transmits the inverted true data to a second inverter 36.

The data output buffer further includes a second NOR gate 32 for receiving complement data/CD of low logic from a second input line 33 and the inverted enable signal from the first inverter 34. Similar to the first NOR gate 30, the second NOR gate 12 serves to invert the complement data/CD received from the second input line 33 in response to the low logic enable signal received from the first inverter 34. The first and second input lines 31 and 33 receive true and complement data/TD and/CD from sense amplifiers not shown, respectively.

Furthermore, the data output buffer includes a first PMOS transistor 38 connected among a first power supply source Vcc, an output line 37 and the second inverter 36. The first PMOS transistor 38 is turned on upon receiving a low logic signal from the second inverter 36 at the gate thereof so that a first supply voltage of positive electrical potential from the first power supply source Vcc can be supplied to the output line 37 via the drain and source of the activated first PMOS transistor 38. The output line 37 transmits the high level, first supply voltage from the first power supply source Vcc to an external circuit device not shown, thereby enabling high logic data to be supplied to the external circuit device. When the first NOR gate 30 receives true data of low logic and the inverted enable signal, the first PMOS transistor 38 is also turned on in response to the true data of low logic received via the second inverter 36.

The data output buffer also includes a first NMOS transistor 40 connected among a second power supply source GND, the output line 37 and the output line 39 connected to the second NOR gate 32. The first NMOS transistor 40 is turned on upon receiving the inverted complement data of high logic from the second NOR gate 32 via the output line 39 at the gate thereof. At the turned-on state, the first NMOS transistor 40 bypasses a voltage on the output line 37 toward the second power supply source GND, thereby causing the output line 37 to supply data with the low level, second supply voltage GND to the external circuit device. When the second NOR gate 32 receives complement data/CD of low logic and the inverted enable signal, the first NMOS transistor 40 is also turned on.

The first PMOS transistor 38 is used as a pull-up driver while the first NMOS transistor 40 is used as a pull-down driver.

A second NMOS transistor 44 is also provided which is connected among the output line 37, the second power supply source GND and the output line 39 connected to the second NOR gate 32. The second NMOS transistor 42 serves to bypass, toward the second power supply source GND, a part of current to be applied from the second NOR gate 32 to the gate of the first NMOS transistor 40 via the output line 39, in accordance with the level of voltage applied to the gate thereof via the output line 37. The amount of current bypassed from the second NOR gate 32 toward the second power supply source GND via the output line 39 is proportional to the level of voltage applied to the gate of the second NMOS transistor 42 via the output line 37. In other words, as the voltage on the output line 37 is decreased in level, the amount of current applied from the output line 39 of the second NOR gate 32 to the gate of the first NMOS transistor 40 is gradually increased. By virtue of such a gradual increase in the current amount at the gate of the first NMOS transistor 40, it is possible to mostly inhibit the generation of ground noise signals at the trailing edge of low logic data on the output line 37. Consequently, the second NMOS transistor 42 functions as a variable resistor for controlling the amount of current to be supplied to the gate of the first NMOS transistor 40, depending on the level of voltage on the output line 37.

Furthermore, the data output buffer includes a third NMOS transistor 44 for selectively connecting the drain of the second NMOS transistor 42 to the output line 39 of the second NOR gate 32, and a second PMOS transistor 46 for receiving the complement data CD from the second input line 33 at the gate thereof. The second PMOS transistor 46 is turned on when the complement data/CD of low logic from the second input line 33 is applied to the gate thereof. At the turned-on state, the second PMOS transistor 46 receives the first supply voltage from the first power supply source Vcc at the drain thereof and then transmits it to the drain of a third PMOS transistor 48 via the source thereof. Consequently, the second PMOS transistor 46 functions as a control switch adapted to be driven by the complement data/CD. The third PMOS transistor 48 is connected with fourth and fifth PMOS transistors 50 and 52 between the source of the second PMOS transistor 46 and junction 41 to the third NMOS transistor 44. Each of the third, fourth and fifth PMOS transistors 48, 50 and 52 is constructed to connect its gate to its source and thereby to serve as a resistor for a voltage drop. Accordingly, the third, fourth and fifth PMOS transistors 48, 50 and 52 drop sequentially the first supply voltage Vcc received from the source of the second PMOS transistor 46 by respective operating voltages Vt thereof. The dropped voltage is then applied to the gate of the third NMOS transistor 44.

At the turned-on state of the second PMOS transistor 46, the voltage $V_{41}$ applied to the junction 41 has a voltage level attenuated by the sum 3 Vt of the operating voltages Vt of the third, fourth and fifth PMOS transistors 40, 50 and 52. When the first supply voltage Vcc rises in level, the voltage $V_{41}$ at the junction 41 goes up correspondingly. The third NMOS transistor 44 is turned on by the 3 Vt-dropped first supply voltage (Vcc - 3 Vt) supplied from the junction 41 at the turned-on state of the second PMOS transistor 42. As a result, the second NMOS transistor 42 is connected at the drain thereof to the output line 39 of the second NOR gate 39. At this time, the third NMOS transistor 44 varies the amount of current to be applied from the output line 39 of the second NOR gate 32 to the drain of the second NMOS transistor 42, depending on the voltage level at the junction 41, that is, a variation in the first supply voltage.

Finally, the data output buffer includes a fourth NMOS transistor 54 connected among the second input line 33, the output line 39 of the second NOR gate 32 and the junction 41. The fourth NMOS transistor 54 is turned on when the complement data/CD of high logic from the second input line 33 is applied to the gate thereof. At the turned-on state of the fourth NMOS transistor 54, the junction 41 is conducted with the output line 39 of the second NOR gate 32, so that the voltage remaining on the junction 41 can be bypassed toward the output line 39 of the second NOR gate 32. By coupling between the junction and the output line 39 of the second NOR gate 32, the third NMOS transistor 44 is forcedly turned off, thereby causing the drain of the second NMOS transistor 42 to be disconnected from the output line 39 of the second NOR gate 32. Consequently, the fourth NMOS transistor 54 serves to prevent both the second NMOS transistor 42 and the first NMOS transistor 40 from malfunctioning when no low logic data is outputted through the output line 37.

FIG. 3 is a table showing a variation in peak output current and an instantaneous variation in output current in the data output buffer of the present invention, depending on the voltage level difference between the power supply sources Vcc and GND, as compared to those in the conventional data output buffer. These variations are measured at 5 V, 6 V, 8 V and 9 V, respectively. At the voltage level difference of 5 V, the measurement is performed at the temperature of 25° C. At the other voltage level differences, the measurement is performed at the temperature of −10° C. By referring to FIG. 3, it can be found that the data output buffer of the present invention generates the peak output current substantially corresponding to 50 to 75% of that of the conventional data output buffer. In terms of the instantaneous variation in output current, the data output buffer of the present invention exhibits a reduction to 77 to 25% of that of the conventional data output buffer.

As apparent from the above description, the data output buffer of the present invention provides an advantage of minimizing generation of ground noise at the trailing edge of low logic output data, by gradually increasing the amount of current applied to the gate of the pull-down MOS transistor in accordance with the voltage level on the output line.

It will be also appreciated that where the amount of current applied to the gate of the pull-up MOS transistor is varied to be controlled depending on the voltage level on the output line, in accordance with the present invention, the noise signal generated at the leading edge of high logic output data can be minimized.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A data output buffer in a semiconductor memory device comprising:
    a first input line for inputting true data;
    a second input line for inputting complement data;
    a pull-up transistor connected among a first power supply source, an output line and said first input line;
    a pull-down transistor connected among a second power supply source, said output line and said second input line; and
    variable resistor means for controlling an amount of current being supplied from the second input line to said pull-down transistor, and thereby removing a noise signal to be included in output data of low logic on the output line.

2. A data output buffer in accordance with claim 1, further comprising switch means for selectively connecting said variable resistor means to said second input line only when said complement data is applied to the second input line.

3. A data output buffer in accordance with claim 2, wherein said variable resistor means comprises a MOS transistor.

4. A data output buffer in accordance with claim 1, further comprising:
    first switch means for selectively opening and closing a current path between said variable resistor means and said second input line; and
    switch control means for controlling said first switch means so that the amount of current flowing in said current path can be controlled depending on a voltage level difference between said first and second power supply sources.

5. A data output buffer in accordance with claim 4, wherein said first power supply source has a positive voltage level and said second power supply source has a ground voltage level.

6. A data output buffer in accordance with claim 5, wherein said first switch means comprises an NMOS transistor having a drain connected to said second input line and a source connected to said variable resistor means and wherein said switch control means comprises voltage drop means connected between said first power supply source and said NMOS transistor.

7. A data output buffer in accordance with claim 6, wherein said switch control means further comprises second switch means for controlling a connection between said first power supply source and said voltage drop means, depending on logic state of said second input line.

8. A data output buffer in accordance with claim 7, wherein said second switch means is adapted to connect said first power supply source and said voltage drop means when said complement data is applied to said second input line.

9. A data output buffer in accordance with claim 8, further comprising third switch means connected between a gate of said NMOS transistor and said second input line and adapted to bypass a voltage remaining said NMOS transistor gate when no complement data is applied to the second line.

* * * * *